United States Patent [19]

Davies

[11] Patent Number: 5,006,736
[45] Date of Patent: Apr. 9, 1991

[54] CONTROL CIRCUIT FOR RAPID GATE DISCHARGE

[75] Inventor: Robert B. Davies, Tempe, Ariz.

[73] Assignee: Motorola, Inc., Schaumburg, Ill.

[21] Appl. No.: 365,403

[22] Filed: Jun. 13, 1989

[51] Int. Cl.$^5$ ............................................. H03K 17/16
[52] U.S. Cl. .................................... 307/570; 307/318; 307/573; 307/577; 307/581; 307/584
[58] Field of Search ............... 307/270, 300, 318, 570, 307/573, 575, 577, 581, 584

[56] References Cited

U.S. PATENT DOCUMENTS

| | | | |
|---|---|---|---|
| 3,955,103 | 5/1976 | Russell et al. | 307/573 |
| 4,471,245 | 9/1984 | Janutka | 307/571 |
| 4,481,434 | 11/1984 | Janutka | 307/570 |
| 4,492,883 | 1/1985 | Janutka | 307/571 |
| 4,500,801 | 2/1985 | Janutka | 307/570 |
| 4,651,035 | 3/1987 | Shigekane | 307/581 |
| 4,746,814 | 5/1988 | Shigekane | 307/570 |
| 4,777,387 | 10/1988 | Collins | 307/570 |
| 4,804,866 | 2/1989 | Akiyama | 307/570 |
| 4,868,421 | 9/1989 | Herndon et al. | 307/570 |
| 4,894,568 | 1/1990 | Pavlin | 37/570 |
| 4,906,868 | 3/1990 | Maki et al. | 307/570 |
| 4,956,565 | 9/1990 | Bahlmann | 307/270 |

FOREIGN PATENT DOCUMENTS

| | | | |
|---|---|---|---|
| 0088931 | 5/1983 | Japan | 307/570 |
| 0154713 | 8/1985 | Japan | 307/584 |
| 0296819 | 12/1986 | Japan | 307/570 |

Primary Examiner—Stanley D. Miller
Assistant Examiner—T. Cunningham
Attorney, Agent, or Firm—Michael D. Bingham

[57] ABSTRACT

A single 3-terminal integrated circuit for controlling a switching device provides both control terminal voltage limitation and rapid turn off time. In an alternative embodiment the control circuit is contained in the same package which houses the controlled switching device.

8 Claims, 1 Drawing Sheet

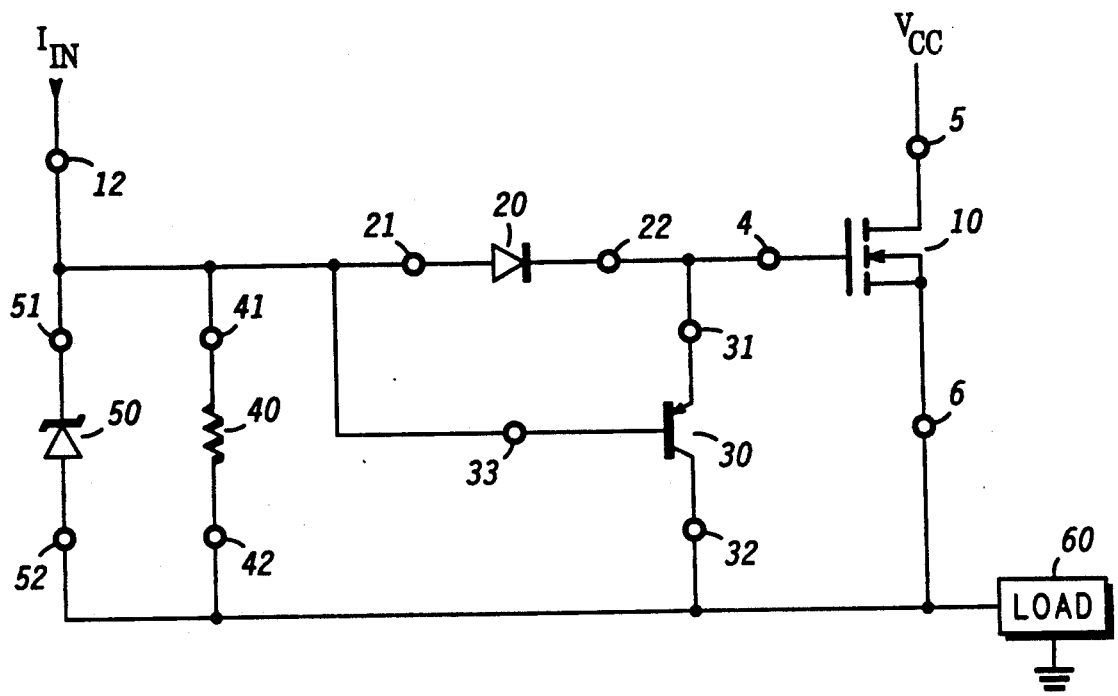
FIG. 1
—PRIOR ART—
FIG. 2
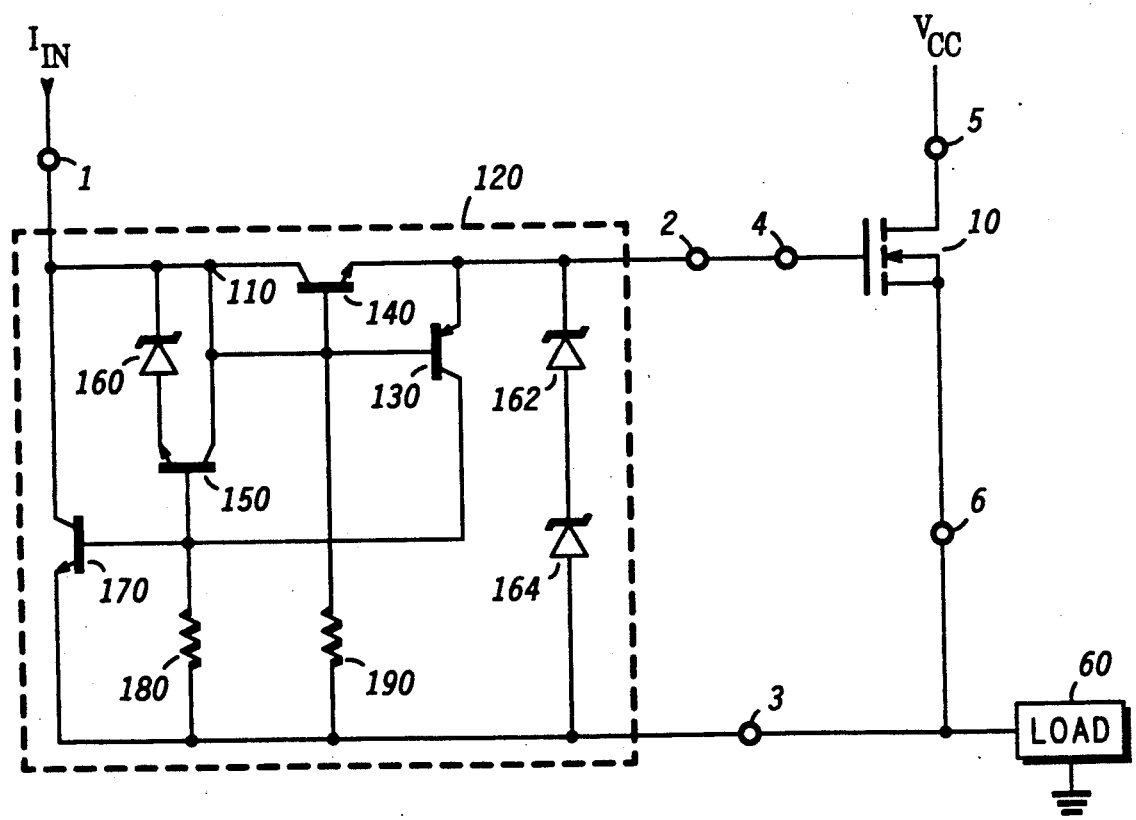

CONTROL CIRCUIT FOR RAPID GATE DISCHARGE

BACKGROUND OF THE INVENTION

This invention relates, in general, to control circuits and, more particularly, to an integrated control circuit which both limits the gate drive voltage of a MOS device and provides a rapid discharge of the gate of a MOS device.

There are currently available circuits which provide both gate drive voltage limit and gate discharge functions. However, these circuits are comprised of discrete components which are combined and coupled to the MOS device to provide the desired functions. These discrete component circuits not only require additional circuit board space in a given application but ordinarily accomplish the gate discharge function with a single transistor thereby providing a relatively slow turn-off time.

SUMMARY OF THE INVENTION

It is therefore an object of the present invention to provide a control circuit which provides both a limitation of gate drive voltage and a means to discharge the gate capacitance of a MOS device in a single three terminal integrated circuit.

Another object of the present invention is to provide a control circuit which is contained in a single integrated circuit and provides a very rapid gate discharge or turn-off time for the MOS device.

It is still further an object of the present invention to provide an integral control circuit which is housed completely within the package which contains the MOS device being controlled.

The above and other features and objects are provided in the present invention wherein there is provided an integrated control circuit comprising first, second, third and fourth transistors each having a control terminal and first and second load terminals. The first load terminals of said first and second transistors are coupled together for coupling to the gate terminal of a MOS device having a gate terminal and first and second load terminals. The control terminals of said first and second transistors are coupled together and coupled to the second load terminals of said second, third and fourth transistors and to an input terminal for receiving an input current.

The cathode and anode of a first zener diode are respectively coupled to the second and first load terminals of said third transistor. The first terminals of a first and second resistor are respectively coupled to the control terminals of said second and third transistors while the second terminals of said first and second resistors are coupled together and coupled to the first load terminal of said fourth transistor for coupling to said second load terminal of said MOS device. The second load terminal of said first transistor is coupled to the control terminals of said third and fourth transistors.

The cathode of a second zener diode is coupled to the first load terminals of said first and second transistors while the anode terminal is coupled to the cathode of a third zener diode, the anode of which is coupled to the second terminals of said first and second resistors.

BRIEF DESCRIPTION OF THE DRAWINGS

The above mentioned and other features of the invention and the manner of attaining them will become more apparent and the invention itself would be best understood by reference to the following description of an embodiment of the invention taken in conjunction with the accompanying drawings, wherein:

FIG. 1 is a schematic diagram of a typical prior art MOS control circuit; and

FIG. 2 is a schematic diagram of a preferred embodiment of the present invention.

DETAILED DESCRIPTION OF THE DRAWINGS

FIG. 1 shows a typical prior art control circuit comprising diode 20, PNP transistor 30, resistor 40 and zener diode 50. MOS transistor 10 is used to supply voltage from source terminal 5 through drain terminal 6 to load 60. Gate terminal 4 of MOS transistor 10 receives input current through diode 20 thereby charging the gate and turning on MOS transistor 10. In operation the parallel combination of zener diode 50 and resistor 40 provides a limit to the gate voltage applied to gate terminal 4 of MOS transistor 10 through diode 20. When the control voltage is removed from input terminal 12 the built-up charge on gate terminal 4 of power transistor 10 is removed by discharging through transistor 30. When the input voltage is removed from terminal 12 base terminal 33 of transistor 30 becomes low thereby turning on transistor 30 and discharging gate terminal 4 of power transistor 10 through emitter 31 and collector 32 of transistor 30.

As can be seen there are 4 separate discrete components required to provide the combined gate voltage limiting and gate capacitance discharge functions of the control circuit shown. In addition the gate capacitance discharge path consists of only a single transistor 30.

FIG. 2 is a schematic of the present invention wherein integrated circuit 120 comprises transistors 130, 140, 150 and 170; zener diodes 160, 162 and 164; and resistors 180 and 190. The collector of NPN transistor 140 for coupling to a current source is coupled to the collector of NPN transistor 150, the collector of NPN transistor 170, the base of PNP transistor 130, the base of transistor 140, the first terminal of resistor 190 and the cathode of zener diode 160. The collector of transistor 130 is coupled to the base of transistor 150, the base of transistor 170 and the first terminal of resistor 180. The emitter of transistor 170 is coupled to the second terminals of resistors 180 and 190 for coupling to load 60 and to source terminal 6 of MOS transistor 10. The emitter of NPN transistor 140 is coupled to the emitter of PNP transistor 130 and to the cathode of zener diode 162 for coupling to gate terminal 4 of MOS transistor 10. The anode of zener diode 162 is coupled to the cathode of zener diode 164, the anode of which is coupled to the emitter of NPN transistor 170. The anode of zener diode 160 is coupled to the emitter of transistor 150 and drain terminal 5 of MOS transistor 10 is coupled to a source of supply voltage.

MOS transistor 10 is used as before to provide a connection between supply voltage $V_{cc}$ through drain terminal 5 and source terminal 6 to load 60. This is accomplished by providing a drive current $I_{IN}$ at terminal 1 which charges gate terminal 4 of power transistor 10. In operation transistor 140, with its base shorted to its collector, provides a function similar to that of diode 20 in the prior art circuit.

The gate drive voltage limitation is provided by the combination of zener diode 160, transistor 150, transistor 170 and resistor 180. The value of the gate limit voltage for the device shown is determined by the sum of the zener voltage of diode 160, the $V_{EBO}$ of transistor 150, and the $V_{BE}$ of transistor 170. In practice zener diodes 160, 162 and 164 are ordinarily constructed the same as the base emitter junctions of transistors 150 and 170 so the reverse bias breakdown voltages are the same. The total breakdown voltage will therefore be 2 $V_{EBO}$ of transistor 170 plus $V_{BE}$ of transistor 170. As will be discussed later it is possible to tailor the gate limit voltage by providing base diffusion enhancement regions which would allow independent control of the $V_{EBO}$ values for zener diode 160 and transistor 150 from that of transistor 170.

The breakdown path is through zener diode 160, the emitter base junction of transistor 150 and the base emitter junction of transistor 170 with the breakdown current being controlled by selecting the value of resistor 180. Thus the function provided by zener diode 50 in FIG. 1 is now provided by the combination of zener diode 160, transistor 150, transistor 170 and resistor 180. Resistor 190 of FIG. 2 provides a current path similar to that provided by resistor 40 of the prior art device. Series connected zener diodes 162 and 164 are optionally provided when large MOS devices are being driven to provide a more positive clamp of the gate drive voltage.

The gate capacitance discharge path provided by transistor 30 of FIG. 1 is now provided by the combination of transistor 130 and transistor 170 which acts as an SCR thereby providing a much faster turn-off time than that provided by transistor 30 of FIG. 1. The combination of transistors 130 and 170 acts in normal SCR fashion wherein the removal of voltage from terminal 1 allows the base of transistor 130 to go low thereby turning on transistor 130 the collector current of which then provides base drive to transistor 170. The SCR action of this combination provides a much faster discharge than would be provided by the single PNP transistor of the prior art circuit.

All of the components shown within the dotted line of FIG. 2 are contained in a single integrated circuit 120 having three terminals 1, 2 and 3. This single three terminal device now provides the function formerly provided by four separate discrete components and in addition provides a much faster turn-off time when the device is operated to turn-off MOS transistor 10. In addition, all of the components shown can be provided during the standard process, known to those skilled in the art, which would be used to manufacture transistor 170. This manufacturing process would include, for example, an N+ substrate with N epitaxial layer, P base diffusion, N+ emitter diffusion, pre ohmic cut and metal passivation. As discussed earlier an additional mask, exposing base diffusion enhancement regions, may be used to tailor the $V_{EBO}$ values for zener diode 160 and transistor 150 independently from that of transistor 170.

As an alternative embodiment the entire integrated circuit 120 is housed within the package containing MOS transistor 10, that is to say terminal 1 would become the connection to the overall device, the connection between terminals 2 and 4 shown in FIG. 2 would be accomplished inside the housing and the connection between terminals 3 and 6 would also be accomplished inside the housing. In yet another alternative embodiment the connection between terminals 2 and 4 shown in FIG. 2 would be brought out to provide external access thereby creating a four terminal device which contains all of the circuitry of the inventive device and the MOS device.

What has been provided therefore is an integrated control circuit having an improved turnoff time. In an alternative embodiment the entire control circuit is contained within the same package which houses the MOS device being controlled. While there have been described above the principles of the invention and specific configurations in conjunction with specific devices, it is to be clearly understood that this description is made only by way of example and not as a limitation to the scope of the invention. For example, this control circuit can be used to control various other switching devices which require similar voltage limit and control terminal discharge functions.

I claim:

1. A control circuit having an input terminal, an output terminal and a reference terminal, for coupling to a switching device, the switching device having a control terminal, a first load terminal for coupling to a source of supply voltage and a second load terminal for coupling to a load, the control circuit comprising:

current supply circuit means coupled between the input terminal and the output terminal and responsive to a current signal applied at the input terminal for providing a current path from the input terminal to the output terminal, said current supply means including a first transistor having a control terminal and first and second load terminals, said first load terminal of said first transistor coupled to the output terminal, and said control and second load terminals coupled to the input terminal;

zener diode means coupled between the output terminal and the reference terminal for limiting the voltage thereacross;

silicon controlled rectifier means coupled to the input terminal, to the output terminal and to the reference terminal for providing a discharge path from the output terminal to the reference terminal in response to said current signal applied at the input terminal;

a second transistor having a control terminal and first and second load terminals, said second load terminal of said second transistor being coupled to the input terminal, said silicon controlled rectifier means including a third transistor having a control terminal and first and second load terminals, said first load terminal of said third transistor being coupled to the reference terminal, said second load terminal of said third transistor being coupled to the input terminal, and said control terminal of said third transistor being coupled to said control terminal of said second transistor;

a first zener diode having cathode and anode terminals, said anode terminal being coupled to said first load terminal of said second transistor, and said cathode terminal being coupled to said second load terminals of said second and third transistors; and a first resistor having first and second terminals, said first terminal being coupled to said control terminals of said second and third transistors, and said second terminal being coupled to the reference terminal, wherein said current supply circuit means, said zener diode means, said silicon controlled rectifier means, said second transistor, said first zener diode and said first resistor are all contained in a single integrated circuit and wherein the output terminal is for coupling to the control terminal of the switching device and the reference terminals is for coupling to the second load terminal of the switching device.

2. The control circuit in accordance with claim 1 wherein said silicon controlled rectifier means further includes a fourth transistor having a control terminal and first and second load terminals and a second resistor having first and second terminals, said first load terminal of said fourth transistor being coupled to the output terminal, said control terminal of said fourth transistor being coupled to the input terminal and to said first terminal of said second resistor, said second load terminal of said fourth transistor being coupled to said control terminal of said third transistor, and said second terminal of said second resistor being coupled to the reference terminal.

3. A control circuit in accordance with claim 2 wherein said zener diode means includes second and third zener diodes each having a cathode and anode terminal, said cathode terminal of said second zener diode coupled to said output terminal, said anode terminal of said second zener diode coupled to said cathode terminal of said third zener diode, and said anode terminal of said third zener diode coupled to said reference terminal.

4. The control circuit in accordance with claim 1 wherein the switching device is contained within said single integrated circuit, the control circuit is contained entirely within said single integrated circuit, the output terminal is coupled to the control terminal of the switching device, and the input terminal and the first and second load and control terminals of the switching device are external to said single integrated circuit.

5. An integrated circuit comprising a control circuit having an input terminal, an output terminal and a reference terminal, for coupling to a switching device, the switching device having a control terminal, a first load terminal for coupling to a source of supply voltage and a second load terminal for coupling to a load, the control circuit comprising:

current supply circuit means coupled between the input terminal and the output terminal and responsive to a current signal applied at the input terminal for providing a current path from the input terminal to the output terminal, said current supply circuit means including a first transistor having a control terminal and first and second load terminals, said first load terminal of said first transistor coupled to the output terminal, and said control and second load terminals of said first transistor to the input terminal;

zener diode means coupled between the output terminal and the reference terminal for limiting the voltage thereacross;

a second transistor having a control terminal and first and second load terminals, said second load terminal being coupled to the input terminal;

a first zener diode having cathode and anode terminals, said anode terminal being coupled to said first load terminal of said second transistor, and said cathode terminal being coupled to the input terminal; and a first resistor having first and second terminals, said first terminal being coupled to said control terminal of said second transistor, and said second terminal being coupled to the reference terminal; and a discharge circuit including third and fourth transistors each having a control terminal and first and second load terminals, said first load terminal of said third transistor coupled to the output terminal, said control terminal of said third transistor coupled to the input terminal and to said second load terminal of said fourth transistor, said second load terminal of said third transistor coupled to said control terminal of said fourth transistor, and said first load terminal of said fourth transistor coupled to the reference terminal wherein the output terminal is for coupling to the control terminal of the switching device and the reference terminal is for coupling to the second load terminal of the switching device.

6. The integrated circuit in accordance with claim 5 wherein said zener diode means includes second and third zener diodes each having a cathode and anode terminal, said cathode terminal of said second zener diode coupled to the output terminal, said anode terminal of said second zener diode coupled to said cathode terminal of said third zener diode, and said anode terminal of said third zener diode coupled to the reference terminal.

7. The integrated circuit in accordance with claim 5 wherein said switching device is contained within the integrated circuit, the output terminal is coupled to said control terminal of said switching device and the input terminal and said first and second load terminals of said switching device are external to the integrated circuit.

8. The integrated circuit in accordance with claim 7 wherein said control terminal of said switching device is also external to the integrated circuit.

* * * * *